(12) United States Patent
Li et al.

(10) Patent No.: US 10,567,049 B2
(45) Date of Patent: Feb. 18, 2020

(54) METHODS AND APPARATUSES FOR TRANSMITTING CODING INDICATION INFORMATION AND DETERMINING PRECODING MATRIX

(71) Applicant: China Academy of Telecommunications Technology, Beijing (CN)

(72) Inventors: Hui Li, Beijing (CN); Shanzhi Chen, Beijing (CN); Qiubin Gao, Beijing (CN); Runhua Chen, Beijing (CN); Wenhong Chen, Beijing (CN); Tamrakar Rakesh, Beijing (CN)

(73) Assignee: China Academy of Telecommunications Technology Beijing, Beijing (CN)

( * ) Notice: Subject to any disclaimer, the term of this patent is extended or adjusted under 35 U.S.C. 154(b) by 12 days.

(21) Appl. No.: 15/755,090

(22) PCT Filed: Jul. 19, 2016

(86) PCT No.: PCT/CN2016/090523
§ 371 (c)(1),
(2) Date: Feb. 26, 2018

(87) PCT Pub. No.: WO2017/032185
PCT Pub. Date: Mar. 2, 2017

(65) Prior Publication Data
US 2018/0241445 A1    Aug. 23, 2018

(30) Foreign Application Priority Data
Aug. 24, 2015    (CN) .......................... 2015 1 0524737

(51) Int. Cl.
*H04B 7/0456*    (2017.01)
*H03M 1/26*    (2006.01)
(Continued)

(52) U.S. Cl.
CPC ............ *H04B 7/0456* (2013.01); *H03M 1/26* (2013.01); *H04B 7/0617* (2013.01); *H04B 7/0619* (2013.01); *H04L 25/03898* (2013.01)

(58) Field of Classification Search
CPC .. H04B 7/0456; H04B 7/0617; H04B 7/0619; H03M 1/26; H04L 25/03898
See application file for complete search history.

(56) References Cited

U.S. PATENT DOCUMENTS

2012/0039402 A1    2/2012    Clerckx et al.
2012/0113830 A1*   5/2012    Zhu ........................ H04B 7/024
                                                              370/252
(Continued)

FOREIGN PATENT DOCUMENTS

CN    101969366 A    2/2011
CN    103004119 A    3/2013
(Continued)

OTHER PUBLICATIONS

Milan Narandzic, et al., "3D-Antenna Array Model for IST-WINNER Channel Simulations", Apr. 22-25, 2007, 5 pages.

*Primary Examiner* — Jaison Joseph
(74) *Attorney, Agent, or Firm* — Kilpatrick Townsend & Stockton, LLP

(57) ABSTRACT

Methods and apparatuses for transmitting coding indication information and determining a precoding matrix, for use in resolving the problem that the resolution of code words in a codebook generated by using a combination of a beam vector subgroup and column selection cannot be flexibly adjusted. The method comprises: determining first precoding indication information and second precoding indication information, the first precoding indication information corresponding to a first-stage precoding matrix, the second precoding indication information corresponding to a direction weighting vector and a phase adjustment factor, the (Continued)

---

S11

A UE determines first pre-coding indication information and second pre-coding indication information, where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor

S12

The UE transmits the first pre-coding indication information and the second pre-coding indication information to the network side direction weighting vector being used for performing interpolation processing on parts representing angles corresponding to beam vectors in the all beam vectors in each polarization direction in the first-stage precoding matrix, the phase adjusting factor being used for performing phase adjustment on different polarization directions of the first-stage precoding matrix, and the first-stage precoding matrix, the direction weighting vector, and the phase adjustment factor being used for generating a precoding matrix. The resolution of a precoding matrix is flexibly adjusted by using a direction weighting vector.

12 Claims, 3 Drawing Sheets

(51) Int. Cl.
*H04L 25/03* (2006.01)
*H04B 7/06* (2006.01)

(56) References Cited

U.S. PATENT DOCUMENTS

| | | | |
|---|---|---|---|
| 2012/0269290 A1* | 10/2012 | Onggosanusi | H04L 25/03343 375/296 |
| 2015/0341092 A1* | 11/2015 | Park | H04B 7/0469 370/329 |
| 2017/0170883 A1* | 6/2017 | Zhang | H04B 7/0417 |
| 2018/0167115 A1* | 6/2018 | Zhu | H04B 7/0478 |
| 2018/0205428 A1* | 7/2018 | Lan | H04B 7/04 |

FOREIGN PATENT DOCUMENTS

| | | |
|---|---|---|
| CN | 103004121 A | 3/2013 |
| CN | 103109482 A | 5/2013 |
| CN | 103444115 A | 12/2013 |
| CN | 103477584 A | 12/2013 |
| CN | 103493414 A | 1/2014 |
| CN | 103814539 A | 5/2014 |
| CN | 103944621 A | 7/2014 |
| CN | 105450273 A | 3/2016 |
| EP | 2701325 A1 | 2/2014 |
| WO | 2012061605 A2 | 5/2012 |
| WO | 2015102395 A1 | 7/2015 |

* cited by examiner

METHODS AND APPARATUSES FOR TRANSMITTING CODING INDICATION INFORMATION AND DETERMINING PRECODING MATRIX

This application is a US National Stage of International Application No. PCT/CN2016/090523, filed on Jul. 19, 2016, designating the United States, and claiming the benefit of Chinese Patent Application No. 201510524737.8, filed with the Chinese Patent Office on Aug. 24, 2015 and entitled "Method and apparatus for transmitting coding indication information, and method and apparatus for determining a pre-coding matrix", which is hereby incorporated by reference in its entirety.

FIELD

The present invention relates to the field of communications, and particularly to a method and apparatus for transmitting coding indication information, and a method and apparatus for determining a pre-coding matrix.

BACKGROUND

At present, in a Long Term Evolution (LTE) system, a pre-coding codebook is generally based upon Discrete Fourier Transform (DFT) vectors, and structured as a two-level codebook. Taking an 8-antenna codebook in Rel-12, a subset of DFT beam vectors is determined at a first level, and a User Equipment (UE) feeds an index of the subset of beam vectors among all of subsets of beam vectors, i.e., a Pre-coding Matrix Indicator 1 (PMI1), back to an eNB; and column selection is made at a second level from the subset of DFT beam vectors by selecting one or more columns from the subset, phase adjustment between polarization directions is made, and the UE feeds an index of the column selection and phase adjustment above among all of possible combinations (i.e., a PMI2) back to the eNB. The eNB generates, from the PMI1 and the PMI2 fed back at the two levels, a resulting pre-coding matrix for transmitting downlink data.

In the existing LTE system, the resolution of a codeword in a codebook generated as a result of column selection from a subset of DFT beam vectors is purely determined by the well defined DFT beam vectors, so the resolution can not be adjusted flexibly, thus degrading the performance of the system.

SUMMARY

Embodiments of the invention provide a method and apparatus for transmitting coding indication information, and a method and apparatus for determining a pre-coding matrix so as to address the problem of failing to adjust flexibly the resolution of a codeword in a codebook generated as a result of column selection from a subset of DFT beam vectors.

An embodiment of the invention provides a method for transmitting coding indication information, the method including:

determining, by a UE, first pre-coding indication information and second pre-coding indication information, wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and transmitting, by the UE, the first pre-coding indication information and the second pre-coding indication information to the network side.

In an implementation, determining, by the UE, the first pre-coding indication information and the second pre-coding indication information includes:

selecting, by the UE, a first level of pre-coding matrix from a set of first level of pre-coding matrixes, and determining the first pre-coding indication information corresponding to the selected first level of pre-coding matrix; and selecting, by the UE, a direction weighting vector from a set of direction weighting vector, and selecting a phase adjusting factor from a set of phase adjusting factor; and determining index information of a combination of the selected direction weighting vector and the selected phase adjusting factor among all the possible combinations as the second pre-coding indication information, or determining index information of the selected phase adjusting factor in the set of phase adjusting factors, and bit information representing the value of the selected direction weighting vector as the second pre-coding indication information.

In an implementation, a beam vector in the first level of pre-coding matrix is a function of the value of an angle corresponding to the beam vector, and such a component of the beam vector that represents the angle corresponding to the beam vector is the value of the angle corresponding to the beam vector; or a beam vector in the first level of pre-coding matrix is a Discrete Fourier Transform (DFT) vector, and such a component of the beam vector that represents the angle corresponding to the beam vector is an exponent component of each element in the beam vector.

Further to any one of the embodiments above, if antenna ports of the UE are two-dimension antenna ports, then:

the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, wherein all the beam vectors in a vertical dimension in the first level of pre-coding matrix correspond to the same angle; or the pre-coding matrix is a functional matrix obtained as a result of interpolation on such components of all the beam vectors in each polarization direction in a vertical dimension in the first level of pre-coding matrix that represent angles corresponding to the beam vectors, using the direction weighting vector, wherein all the beam vectors in a horizontal dimension in the first level of pre-coding matrix correspond to the same angle; or the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector.

An embodiment of the invention provides a method for determining a pre-coding matrix, the method including:

receiving, by the network side, first pre-coding indication information and second pre-coding indication information transmitted by a UE; and determining, by the network side, a pre-coding matrix from the first pre-coding indication information and the second pre-coding indication information;

wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

In an implementation, determining, by the network side, the pre-coding matrix includes:

determining, by the network side, the first level of pre-coding matrix corresponding to the first pre-coding indication information;

determining, by the network side, the direction weighting vector and the phase adjusting factor corresponding to the second pre-coding indication information; and determining, by the network side, a matrix which is a function of the first level of pre-coding matrix, the direction weighting vector and the phase adjusting factor as the pre-coding matrix.

In an implementation, a beam vector in the first level of pre-coding matrix is a function of the value corresponding to an angle of the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then determining, by the network side, the pre-coding matrix includes:

performing, by the network side, interpolation on such components of all the beam vectors in each polarization direction in a horizontal dimension in the first level of pre-coding matrix that represent angles corresponding to the beam vectors, using the direction weighting vector, and determining a resulting functional matrix as the pre-coding matrix, wherein all the beam vectors in a vertical dimension in the first level of pre-coding matrix correspond to a same angle; or performing, by the network side, interpolation on such components of all the beam vectors in each polarization direction in a vertical dimension in the first level of pre-coding matrix that represent angles corresponding to the beam vectors, using the direction weighting vector, and determining a resulting functional matrix as the pre-coding matrix, wherein all the beam vectors in a horizontal dimension in the first level of pre-coding matrix correspond to the same angle; or performing, by the network side, interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector, and determining a resulting functional matrix as the pre-coding matrix.

An embodiment of the invention provides an apparatus for transmitting coding indication information, the apparatus including:

a determining module configured to determine first pre-coding indication information and second pre-coding indication information, wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and a transmitting module configured to transmit the first pre-coding indication information and the second pre-coding indication information to the network side.

In an implementation, the determining module is configured to:

select a first level of pre-coding matrix from a set of first level of pre-coding matrixes, and determine the first pre-coding indication information corresponding to the selected first level of pre-coding matrix; and select a direction weighting vector from a set of direction weighting vector, and select a phase adjusting factor from a set of phase adjusting factor; and determine index information of a combination of the selected direction weighting vector and the selected phase adjusting factor among all the possible combinations as the second pre-coding indication information, or determine index information of the selected phase adjusting factor in the set of phase adjusting factors, and bit information representing the value of the selected direction weighting vector as the second pre-coding indication information.

In an implementation, a beam vector in the first level of pre-coding matrix is a function of the value of an angle corresponding to the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the apparatus are two-dimension antenna ports, then:

the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, wherein all the beam vectors in a vertical dimension in the first level of pre-coding matrix correspond to a same angle; or the pre-coding matrix is a functional matrix obtained as a result of interpolation on such components of all the beam vectors in each polarization direction in a vertical dimension in the first level of pre-coding matrix that represent angles corresponding to the beam vectors, using the direction weighting vector, wherein all the beam vectors in the horizontal dimension in the first level of pre-coding matrix correspond to a same angle; or the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector.

An embodiment of the invention provides an apparatus for determining a pre-coding matrix, the apparatus including:

a receiving module configured to receive first pre-coding indication information and second pre-coding indication information transmitted by a UE; and a processing module configured to determine a pre-coding matrix from the first pre-coding indication information and the second pre-coding indication information;

wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

In an implementation, the processing module is configured to:

determine the first level of pre-coding matrix corresponding to the first pre-coding indication information;

determine the direction weighting vector and the phase adjusting factor corresponding to the second pre-coding indication information; and determine a matrix which is a function of the first level of pre-coding matrix, the direction weighting vector and the phase adjusting factor as the pre-coding matrix.

In an implementation, a beam vector in the first level of pre-coding matrix is a function of the value corresponding to an angle of the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the apparatus are two-dimension antenna ports, then the processing module is configured to:

perform interpolation on such components of all the beam vectors in each polarization direction in a horizontal dimension in the first level of pre-coding matrix that represent angles corresponding to the beam vectors, using the direction weighting vector, and determine a resulting functional matrix as the pre-coding matrix, wherein all the beam vectors in a vertical dimension in the first level of pre-coding matrix correspond to a same angle; or perform interpolation on such components of all the beam vectors in each polarization direction in a vertical dimension in the first level of pre-coding matrix that represent angles corresponding to the beam vectors, using the direction weighting vector, and determine a resulting functional matrix as the pre-coding matrix, wherein all the beam vectors in a horizontal dimension in the first level of pre-coding matrix correspond to the same angle; or perform interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector, and determine a resulting functional matrix as the pre-coding matrix.

An embodiment of the invention provides a UE including a transceiver, and at least one processor connected with the transceiver, wherein:

the processor is configured to read programs in a memory to execute the following operations: determining first pre-coding indication information and second pre-coding indication information, wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and the transceiver is configured to be controlled by the processor to transmit the first pre-coding indication information and the second pre-coding indication information to the network side.

In an implementation, the processor is configured to:

select a first level of pre-coding matrix from a set of first level of pre-coding matrixes, and determine the first pre-coding indication information corresponding to the selected first level of pre-coding matrix; and select a direction weighting vector from a set of direction weighting vector, and select a phase adjusting factor from a set of phase adjusting factor; and determine index information of a combination of the selected direction weighting vector and the selected phase adjusting factor among all the possible combinations as the second pre-coding indication information, or determine index information of the selected phase adjusting factor in the set of phase adjusting factors, and bit information representing the value of the selected direction weighting vector as the second pre-coding indication information.

In an implementation, a beam vector in the first level of pre-coding matrix is a function of the value of an angle corresponding to the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then:

the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, wherein all the beam vectors in a vertical dimension in the first level of pre-coding matrix correspond to the same angle; or the pre-coding matrix is a functional matrix obtained as a result of interpolation on such components of all the beam vectors in each polarization direction in a vertical dimension in the first level of pre-coding matrix that represent angles corresponding to the beam vectors, using the direction weighting vector, wherein all the beam vectors in a horizontal dimension in the first level of pre-coding matrix correspond to the same angle; or the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector.

An embodiment of the invention provides an eNB including a transceiver, and at least one processor connected with the transceiver, wherein:

the processor is configured to read programs in a memory to execute the following operations:

receiving first pre-coding indication information and second pre-coding indication information transmitted by a UE through the transceiver; and determining a pre-coding matrix from the first pre-coding indication information and the second pre-coding indication information;

wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

In an implementation, the processor is configured to:

determine the first level of pre-coding matrix corresponding to the first pre-coding indication information;

determine the direction weighting vector and the phase adjusting factor corresponding to the second pre-coding indication information; and determine a matrix which is a function of the first level of pre-coding matrix, the direction weighting vector and the phase adjusting factor as the pre-coding matrix.

In an implementation, a beam vector in the first level of pre-coding matrix is a function of the value corresponding to an angle of the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then the processing module is configured to:

perform interpolation on such components of all the beam vectors in each polarization direction in a horizontal dimension in the first level of pre-coding matrix that represent angles corresponding to the beam vectors, using the direction weighting vector, and determine a resulting functional matrix as the pre-coding matrix, wherein all the beam vectors in a vertical dimension in the first level of pre-coding matrix correspond to the same angle; or perform interpolation on such components of all the beam vectors in each polarization direction in a vertical dimension in the first level of pre-coding matrix that represent angles corresponding to the beam vectors, using the direction weighting vector, and determine a resulting functional matrix as the pre-coding matrix, wherein all the beam vectors in a horizontal dimension in the first level of pre-coding matrix correspond to the same angle; or perform interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector, and determine a resulting functional matrix as the pre-coding matrix.

In the technical solutions according to the embodiments of the invention, the pre-coding matrix is a matrix which is a function of the first level of pre-coding matrix, the direction weighting vector for interpolation on the first level of pre-coding matrix, and the phase adjusting factor representing the different polarization directions of cross-polarized antennas, where a rough orientation of the UE is determined by the beam vectors in the first level of pre-coding matrix, and further angle interpolation is performed on the respective beam vectors in the first level of pre-coding matrix using the direction weighting vector to thereby make the beam vectors point to a precise orientation of the UE, so that the resolution of the pre-coding matrix can be adjusted flexibly using the direction weighting vector, thus resulting in the high-resolution pre-coding matrix, which can improve the performance of the system. Also since angle interpolation is performed, the constant module characteristic of the codebook can be guaranteed, that is, there is the same transmit power of respective antennas of the UE.

DETAILED DESCRIPTION OF THE EMBODIMENTS

In a multi-antenna system based upon linear pre-coding, a receiver selects an appropriate pre-coding matrix from a well pre-defined set of pre-coding matrixes according to channel information, and feeds an index corresponding to the selected pre-coding matrix back to a transmitter, where the set is referred to as a codebook. A transmitter determines the corresponding pre-coding matrix according to the received index, and performs appropriate preprocessing on a signal to be transmitted, using the pre-coding matrix, thus improving the validity and reliability of transmitting information. The codebook is an indispensable element for performing this process. The codebook needs to be designed to match as much as possible a distribution characteristic of a channel to thereby minimize a performance loss arising from quantization of the codebook. The embodiments of the invention provide a method for generating a codebook through interpolation in a Multiple Input Multiple Output (MIMO) channel so as to address the problem of failing to adjust flexibly the resolution of a codeword in a codebook generated as a result of column selection from a subset of DFT beam vectors.

The embodiments of the invention will be described below in further details with reference to the drawings. It shall be appreciated that the embodiments described here are merely intended to illustrate and set forth the invention, but not to limit the invention thereto.

Figure 1:
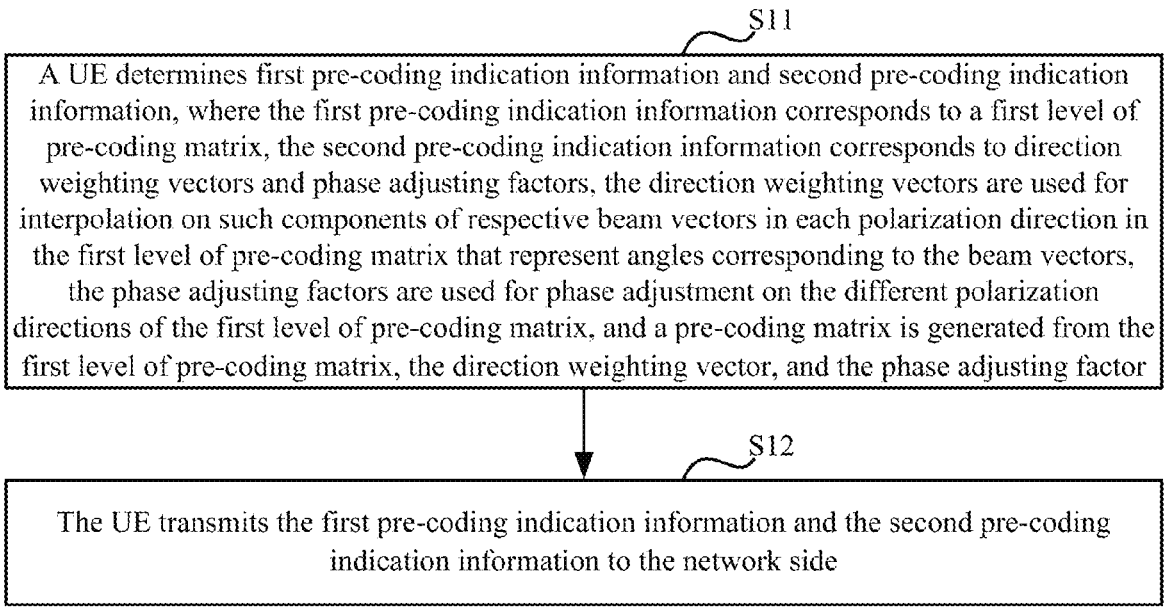
FIG. 1 is a schematic flow chart of a method for transmitting coding indication information according to an embodiment of the invention.

As illustrated in FIG. 1, an embodiment of the invention provides a method for transmitting coding indication information, where the method includes the following operations.

S11: A UE determines first pre-coding indication information and second pre-coding indication information, where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

S12: The UE transmits the first pre-coding indication information and the second pre-coding indication information to the network side.

The pre-coding matrix in the embodiment of the invention is a matrix which is a function of the first level of pre-coding matrix, the direction weighting vector for interpolation on the first level of pre-coding matrix, and the phase adjusting factor representing the different polarization directions of cross-polarized antennas, where a rough orientation of the UE is determined by the beam vectors in the first level of pre-coding matrix, and further angle interpolation is performed on the respective beam vectors in the first level of pre-coding matrix using the direction weighting vector to thereby make the beam vectors point to a precise orientation of the UE, so that the resolution of the pre-coding matrix can be adjusted flexibly using the direction weighting vector, thus resulting in the high-resolution pre-coding matrix, which can improve the performance of the system. Also since angle interpolation is performed, the constant module characteristic of the codebook can be guaranteed, that is, there is the same transmit power of respective antennas of the UE.

In the embodiment of the invention, the pre-coding matrix is represented as $W=f(W_1,c,\phi)$, where $W_1$ represents the first-level of pre-coding matrix, C represents the direction weighting vector, $\phi$ represents the phase adjusting factor, and $f(\ )$ represents a nonlinear function.

In an implementation, the UE determines the first pre-coding indication information and the second pre-coding indication information in the operation S11 as follows.

The UE selects a first level of pre-coding matrix from a set of first level of pre-coding matrixes, and determines the first pre-coding indication information corresponding to the selected first level of pre-coding matrix; and the UE selects a direction weighting vector from a set of direction weighting vector, and selects a phase adjusting factor from a set of phase adjusting factor; and determines index information of a combination of the selected direction weighting vector and the selected phase adjusting factor among all the possible combinations as the second pre-coding indication information, or determines index information of the selected phase adjusting factor in the set of phase adjusting factors, and bit information representing the value of the selected direction weighting vector as the second pre-coding indication information.

By way of an example, the UE can select the first level of pre-coding matrix by selecting a first level of pre-coding matrix maximizing a Channel Quality Indicator (CQI) from the set of first level of pre-coding matrixes according to a channel characteristic.

Alike the UE can select the direction weighting vector by selecting a direction weighting vector maximizing the CQI from the set of direction weighting vectors according to the channel characteristic.

In an implementation, the first pre-coding indication information is an index of the first level of pre-coding matrix selected by the UE in the set of first level of pre-coding matrixes, where the index is represented as PMI1.

In the embodiment of the invention, the set of first level of pre-coding matrixes includes S first level of pre-coding matrixes, each first level of pre-coding matrix includes M beam vectors, and a part or none of beam vectors in two first level of pre-coding matrixes with adjacent indexes are or is the same, where both S and M are positive integers.

Particularly N beam vectors are firstly generated, and there are at least the following two implementations of these beam vectors.

In a first implementation, each beam vector points to an angle $\theta_i$, where i=0, 1, 2, . . . , N−1 For an array of dually polarized antennas, the beam vector is used for an antenna port in a polarization direction, where the i-th beam vector is defined as:

$$v_i = \frac{1}{\sqrt{K}} \begin{bmatrix} 1 \\ e^{j\frac{2\pi}{\lambda}d\cos\theta_i} \\ \vdots \\ e^{j\frac{2\pi}{\lambda}d(k-1)\cos\theta_i} \\ \vdots \\ e^{j\frac{2\pi}{\lambda}d(K-1)\cos\theta_i} \end{bmatrix}.$$

Where k=1, 2, ..., K, and K represents the number of antenna ports corresponding to each polarization direction; λ represents an operating wavelength of a network system; and d represents the spacing between two adjacent antenna ports.

In this implementation, a beam vector in the first level of pre-coding matrix is a function of the value of an angle corresponding to the beam vector, and such a component of the beam vector that represents the angle corresponding to the beam vector is the value of the angle corresponding to the beam vector, i.e., $\theta_l$.

In a second implementation, each beam vector is a DFT vector represented as:

$$v_i = \frac{1}{\sqrt{K}} \begin{bmatrix} 1 \\ e^{j\frac{2\pi}{N}i} \\ \vdots \\ e^{j\frac{2\pi}{N}(k-1)i} \\ \vdots \\ e^{j\frac{2\pi}{N}(K-1)i} \end{bmatrix}.$$

In this implementation, a beam vector in the first level of pre-coding matrix is a DFT vector, and such a component of the beam vector that represents an angle corresponding to the beam vector is an exponent component of each element in the beam vector, that is, such a component of a beam vector $v_i$ that represents an angle corresponding to the beam vector is $$j\frac{2\pi}{N}(k-1)i.$$

Then the N beam vectors are divided into S subsets, and each sub-set includes M beam vectors. Beam vectors in adjacent sub-sets may overlap partially, or may not overlap at all, and each sub-set constitutes a first level of pre-coding matrix. The s-th first level of pre-coding matrix $W_1^{(s)}$ is represented as:

$$W_1^{(s)} = \begin{bmatrix} X^{(s)} & 0 \\ 0 & X^{(s)} \end{bmatrix}$$

$$X^{(s)} = \begin{bmatrix} v_{s \cdot N_p} & v_{s \cdot N_p + 1} & \cdots & v_{s \cdot N_p + M - 1} \end{bmatrix}.$$

Where $N_P$ represents the number of different beam vectors among beam vectors in two first level of pre-coding matrixes with adjacent indexes (i.e., the number of non-overlapping beam vectors in two first level of pre-coding matrixes with adjacent indexes), where $1 \leq N_P \leq M$, and s=0, 1, 2, ..., S-1.

In an implementation, the index of the m-th beam vector in the s-th first level of pre-coding matrix is:

$s \cdot N_P + m$.

Where m=0, 1, 2, ..., M-1.

Furthermore if $s \cdot N_P + m > N - 1$, then the index of the m-th beam vector in the s-th first level of pre-coding matrix will be:

mod($s \cdot N_P + m, N - 1$) - 1.

Where mod( ) represents a modulus operation.

Further to any one of the embodiments above, if the rank of the pre-coding matrix is R (i.e., the number of transmission streams is R), then the pre-coding matrix will be:

$$W = \frac{1}{\sqrt{2 \cdot R}} \begin{bmatrix} Y_+^{(1)} & Y_+^{(2)} & \cdots & Y_+^{(R)} \\ \phi(1) Y_-^{(1)} & \phi(2) Y_-^{(2)} & \cdots & \phi(R) Y_-^{(R)} \end{bmatrix}.$$

Where $\phi(.)$ represents the phase adjusting factor of the two polarization directions, and a possible value thereof is $$\phi(t) \in \left\{ e^{j\frac{2\pi t}{T}}, t = 0, 1, \ldots, T - 1 \right\};$$

and $Y_+^{(r)}$ and $Y_-^{(r)}$ represent pre-coding sub-matrixes of the two different polarization directions at the r-th layer of cross-polarized antennas respectively, and r=1, 2, ..., R.

Where $Y_+^{(r)}$ and $Y_-^{(r)}$ may or may not be the same; $Y_+^{(r)}$ at respective layers may or may not be the same, and $Y_-^{(r)}$ at respective layers may or may not be the same. $Y_+^{(r)}$ will be described below as an example, and the same will apply to $Y_-^{(r)}$, so a repeated description thereof will be omitted here.

By way of an example, if the l-th beam vector $v_l$ is represented in the first implementation above, that is:

$$v_l = \frac{1}{\sqrt{K}} \begin{bmatrix} 1 \\ e^{j\frac{2\pi}{\lambda} d \cos \theta_l} \\ \vdots \\ e^{j\frac{2\pi}{\lambda} d(k-1) \cos \theta_l} \\ \vdots \\ e^{j\frac{2\pi}{\lambda} d(K-1) \cos \theta_l} \end{bmatrix}.$$

Then a beam direction in $X^{(s)}$ will be $[\theta_{s \cdot N_P} \; \theta_{s \cdot N_P + 1} \; \cdots \; \theta_{s \cdot N_P + M - 1}]$. For the sake of a convenient description below, it is written into $[\theta_0^s \; \theta_1^s \; \ldots \; \theta_l^s \; \ldots \; \theta_{M-1}^s]$.

I. If linear interpolation is performed, then a possible implementation of $Y_+^{(r)}$ will be:

$$Y_+^{(r)} = \frac{1}{\sqrt{K}} \begin{bmatrix} 1 \\ \vdots \\ e^{j\frac{2\pi}{\lambda} d(k-1) \cos\left(\sum_{l=0}^{M-1} c_l \theta_l^s\right)} \\ \vdots \\ e^{j\frac{2\pi}{\lambda} d(K-1) \cos\left(\sum_{l=0}^{M-1} c_l \theta_l^s\right)} \end{bmatrix}.$$

Where k=1, 2, ..., K, and K represents the number of antenna ports corresponding to each polarization direction; λ represents an operating wavelength of a network system; d represents the spacing between two adjacent antenna ports; and $c_l$ represents the l-th element in the direction weighting vector, and $c_l$ is any real number in [0, 1], and satisfies $$\sum_{l=0}^{M-1} c_l = 1.$$

It shall be noted that if linear interpolation is performed, then there will be a number M−1 of elements in each direction weighting vector in the set of direction weighting vectors, i.e., $c=[c_0\ c_1\ \ldots\ c_{M-1}]$. The UE selects a direction weighting vector from the set of direction weighting vectors as the direction weighting vector.

II. If nonlinear interpolation is performed, e.g., Lagrange interpolation, then $Y_+^{(r)}$ will be:

$$Y_+^{(r)} = \frac{1}{\sqrt{K}} \begin{bmatrix} 1 \\ \vdots \\ e^{j\frac{2\pi}{\lambda}d(k-1)\cos(\theta_c^s)} \\ \vdots \\ e^{j\frac{2\pi}{\lambda}d(K-1)\cos(\theta_c^s)} \end{bmatrix}.$$

Where $$\theta_c^s = \sum_{j=0}^{M-1} \theta_j^s \cdot L_j^{M-1}(c),\ L_j^{M-1}(c) = \prod_{\substack{i=0 \\ i\neq j}}^{M-1} \frac{c-i}{j-i},$$

c represents the direction weighting vector, and the value of c is any real number in (0,M−1).

It shall be noted that if nonlinear interpolation is performed, then there will be only one element in the direction weighting vector selected by the UE, and the UE will select a real number from the set of direction weighting vectors (i.e., (0,M−1)) as the direction weighting vector. With M=2, linear interpolation is the same as nonlinear interpolation.

By way of an example, if the l-th beam vector $v_l$ is represented in the second implementation above, that is:

$$v_l = \frac{1}{\sqrt{K}} \begin{bmatrix} 1 \\ e^{j\frac{2\pi}{N}l} \\ \vdots \\ e^{j\frac{2\pi}{N}(k-1)l} \\ \vdots \\ e^{j\frac{2\pi}{N}(K-1)l} \end{bmatrix}.$$

Then $X^{(s)} = [v_{s \cdot N_p}\ v_{s \cdot N_p+1}\ \cdots\ v_{s \cdot N_p+M-1}]$.

I. If linear interpolation is performed, then a possible implementation of $Y_+^{(r)}$ will be:

$$Y_+^{(r)} = \frac{1}{\sqrt{K}} \begin{bmatrix} 1 \\ \vdots \\ e^{j2\pi(k-1)\sum_{l=0}^{M-1} c_l \frac{s \cdot N_p+l}{N}} \\ \vdots \\ e^{j2\pi(K-1)\sum_{l=0}^{M-1} c_l \frac{s \cdot N_p+l}{N}} \end{bmatrix}.$$

Where $k=1, 2, \ldots, K$, and K represents the number of antenna ports corresponding to each polarization direction of antennas of the UE; and $c_l$ represents the l-th element in the direction weighting vector, and $c_l$ is any real number in [0, 1], and satisfies $$\sum_{l=0}^{M-1} c_l = 1.$$

II. If nonlinear interpolation is performed, e.g., Lagrange interpolation, then $Y_+^{(r)}$ will be:

$$Y_+^{(r)} = \frac{1}{\sqrt{K}} \begin{bmatrix} 1 \\ \vdots \\ e^{j2\pi(k-1)\theta_c^s} \\ \vdots \\ e^{j2\pi(K-1)\theta_c^s} \end{bmatrix}.$$

Where $$\theta_c^s = \sum_{j=0}^{M-1} \frac{s \cdot N_p+j}{N} \cdot L_j^{M-1}(c),\ L_j^{M-1}(c) = \prod_{\substack{i=0 \\ i\neq j}}^{M-1} \frac{c-i}{j-i},$$

c represents the direction weighting vector, and the value of c is any real number in (0,M−1).

Further to any one of the embodiments above, if antenna ports of the UE are two-dimension antenna ports, then the N beam vectors will be Kronecker products of beam vectors in the horizontal dimension, and beam vectors in the vertical dimension. The i-th beam vector is represented as:

$$v_i = v_{vi}^{(v)} \otimes v_{hi}^{(h)}.$$

Where $v_{vi}^{(v)}$ represents the vi-th beam vector in the vertical dimension, $v=0, 1, \ldots, N_v$, and $N_v$ represents the number of beam vectors in the vertical dimension; $v_{hi}^{(h)}$ represents the hi-beam vector in the horizontal dimension, $hi=0, 1, \ldots, N_h$, and $N_h$ represents the number of beam vectors in the horizontal dimension; and the total number of beam vectors is $N=N_v N_h$.

If each beam vector is represented in the first implementation, then:

$$V_{vi}^{(v)} = \frac{1}{\sqrt{K_v}} \begin{bmatrix} 1 \\ e^{j\frac{2\pi}{\lambda}d_v \cos\theta_{vi}} \\ \vdots \\ e^{j\frac{2\pi}{\lambda}d_v(k-1)\cos\theta_{vi}} \\ \vdots \\ e^{j\frac{2\pi}{\lambda}d_v(K_v-1)\cos\theta_{vi}} \end{bmatrix}; V_{hi}^{(v)} = \frac{1}{\sqrt{K_h}} \begin{bmatrix} 1 \\ e^{j\frac{2\pi}{\lambda}d_h \cos\theta_{hi}} \\ \vdots \\ e^{j\frac{2\pi}{\lambda}d_h(k-1)\cos\theta_{hi}} \\ \vdots \\ e^{j\frac{2\pi}{\lambda}d_h(K_h-1)\cos\theta_{hi}} \end{bmatrix}.$$

Where $K_v$ and $K_h$ represent the numbers of antenna ports in the vertical dimension and the horizontal dimension corresponding to each polarization direction respectively; $\lambda$ represents an operating wavelength of a network system; and $d_v$ and $d_h$ represent the spacing between two adjacent antenna ports in the vertical dimension and the horizontal dimension respectively.

If each beam vector is represented in the second implementation, then:

$$V_{vi}^{(v)} = \frac{1}{\sqrt{K_v}} \begin{bmatrix} 1 \\ e^{j\frac{2\pi}{N_v}vi} \\ \vdots \\ e^{j\frac{2\pi}{N_v}(k-1)vi} \\ \vdots \\ e^{j\frac{2\pi}{N_v}(K_v-1)vi} \end{bmatrix}; V_{hi}^{(v)} = \frac{1}{\sqrt{K_h}} \begin{bmatrix} 1 \\ e^{j\frac{2\pi}{N_h}hi} \\ \vdots \\ e^{j\frac{2\pi}{N_h}(k-1)hi} \\ \vdots \\ e^{j\frac{2\pi}{N_h}(K_h-1)hi} \end{bmatrix}.$$

Where $N_v$ represents the number of beam vectors in the vertical dimension, and $N_h$ represents the number of beam vectors in the horizontal dimension.

At this time, a diagonal block $X^{(s)}$ in the s-th first level of pre-coding matrix includes M beam vectors in $v_i$, and represented as $X^{(s)} = [v_0^{(s)} \ v_1^{(s)} \ \ldots \ v_{M-1}^{(s)}]$, where there are $M_v$ beam vectors in the vertical dimension, and $M_h$ beam vectors in the horizontal dimension.

The pre-coding matrix can be obtained at least in any one of the following three possible implementations.

In a first implementation, the pre-coding matrix is a functional matrix obtained as a result of interpolation on such components of all the beam vectors in each polarization direction in the horizontal dimension in the first level of pre-coding matrix that represent the angles corresponding to the beam vectors, using the direction weighting vector, where beam vectors in the vertical dimension in the first level of pre-coding matrix correspond to the same angle.

In a second implementation, the pre-coding matrix is a functional matrix obtained as a result of interpolation on such components of all the beam vectors in each polarization direction in the vertical dimension in the first level of pre-coding matrix that represent the angles corresponding to the beam vectors, using the direction weighting vector, where beam vectors in the horizontal dimension in the first level of pre-coding matrix correspond to the same angle.

In a third implementation, the pre-coding matrix is a functional matrix obtained as a result of interpolation on such components of all the beam vectors in each polarization direction in the horizontal dimension in the first level of pre-coding matrix that represent the angles corresponding to the beam vectors, and such components of all the beam vectors in each polarization direction in the vertical dimension that represent the angles corresponding to the beam vectors, using respective direction weighting vectors, using the direction weighting vector.

In this implementation, $c=[c_v \ c_h]$ and $Y_+^{(r)} = Y_{v+}^{(r)} \otimes Y_{h+}^{(r)}$, $c_v = [c_{v0}, c_{v1}, \ldots, c_{vM_v-1}]$, and $c_h = [c_{h0}, c_{h1}, \ldots, c_{hM_h-1}]$; and taking linear interpolation as an example, if each beam vector is represented in the first implementation, then:

$$Y_{v+}^{(r)} = \frac{1}{\sqrt{K_v}} \begin{bmatrix} 1 \\ \vdots \\ e^{j\frac{2\pi}{\lambda}d_v(k-1)\cos\left(\sum_{l=0}^{M_v-1} c_{vl}\theta_{vl}^s\right)} \\ \vdots \\ e^{j\frac{2\pi}{\lambda}d_v(K_v-1)\cos\left(\sum_{l=0}^{M_v-1} c_{vl}\theta_{vl}^s\right)} \end{bmatrix}, \text{ and}$$

$$Y_{h+}^{(r)} = \frac{1}{\sqrt{K_h}} \begin{bmatrix} 1 \\ \vdots \\ e^{j\frac{2\pi}{\lambda}d_h(k-1)\cos\left(\sum_{l=0}^{M_h-1} c_{hl}\theta_{hl}^s\right)} \\ \vdots \\ e^{j\frac{2\pi}{\lambda}d_h(K_h-1)\cos\left(\sum_{l=0}^{M_h-1} c_{hl}\theta_{hl}^s\right)} \end{bmatrix}.$$

Where $c_v$ represents the direction weighting vector in the vertical dimension, and $c_h$ represents the direction weighting vector in the horizontal dimension; $d_v$ represents the spacing in the vertical dimension between two adjacent antenna ports of the UE, and $d_h$ represents the spacing in the horizontal dimension between two adjacent antenna ports of the UE; $M_v$ represents the number of angles of beam vectors in the vertical dimension in $W_1^{(s)}$, and $M_h$ represents the number of angles of beam vectors in the horizontal dimension in $W_1^{(s)}$; and $K_v$ represents the number of antenna ports in the vertical dimension corresponding to each polarization direction of antennas of the UE, and $K_h$ represents the number of antenna ports in the horizontal dimension corresponding to each polarization direction of antennas of the UE.

It shall be noted that the pre-coding matrix can be determined similarly thereto through nonlinear interpolation, so a repeated description thereof will be omitted here. The same will apply to each beam vector represented in the second implementation, so a repeated description thereof will be omitted here.

Further to any one of the embodiments above, in an implementation, the UE transmits the first pre-coding indication information and the second pre-coding indication information to the network side in the operation S12 as follows.

The UE transmits the first pre-coding indication information to the network side periodically at a preset first period; and the UE transmits the second pre-coding indication information to the network side periodically at a preset second period.

In an implementation, the first period is a long period, for example, the first pre-coding indication information is transmitted to the network side once every 100 ms; or the first period is a short period, for example, the first pre-coding indication information is transmitted to the network side once every 10 ms or 5 ms, where the first length of time is larger than the second length of time.

In an implementation, the second period is a short period, for example, the second pre-coding indication information is transmitted to the network side once every 10 ms or 5 ms.

Figure 2:
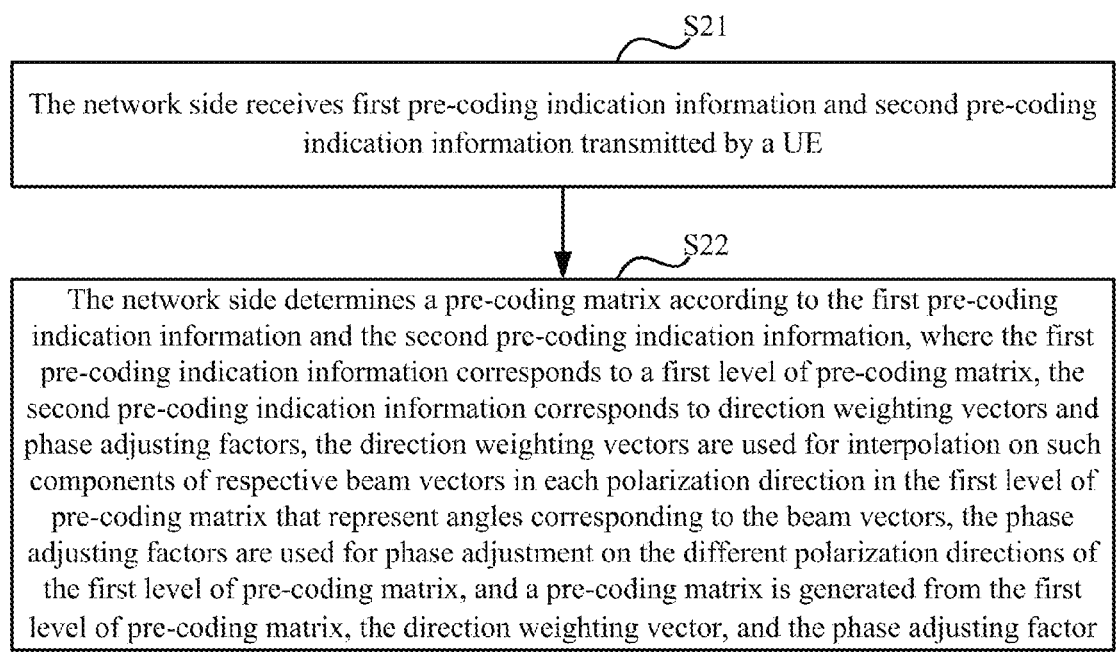
FIG. 2 is a schematic flow chart of a method for determining a pre-coding matrix according to an embodiment of the invention.

Based upon the same inventive idea, as illustrated in FIG. 2, an embodiment of the invention further provides a method for determining a pre-coding matrix at the network side, where the method includes the following operations.

S21: the network side receives first pre-coding indication information and second pre-coding indication information transmitted by a UE.

S22: the network side determines a pre-coding matrix according to the first pre-coding indication information and the second pre-coding indication information.

Where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

In an implementation, the network side determines the pre-coding matrix in the operation S22 as follows.

The network side determines the first level of pre-coding matrix corresponding to the first pre-coding indication information; the network side determines the direction weighting vector and the phase adjusting factor corresponding to the second pre-coding indication information; and the network side determines a matrix which is a function of the first level of pre-coding matrix, the direction weighting vector and the phase adjusting factor as the pre-coding matrix.

In the embodiment of the invention, a beam vector in the first level of pre-coding matrix is a function of the value of an angle corresponding to the beam vector (in the first implementation above), and such a component of the beam vector that represents the angle corresponding to the beam vector is the value of the angle corresponding to the beam vector.

Or, a beam vector in the first level of pre-coding matrix is a DFT vector (in the second implementation above), and such a component of the beam vector that represents the angle corresponding to the beam vector is an exponent component of each element in the beam vector.

Further to any one of the embodiments above, if antenna ports of the UE are two-dimension antenna ports, then the network side will determine the pre-coding matrix as follows.

The network side performs interpolation on such components of all the beam vectors in each polarization direction in the horizontal dimension in the first level of pre-coding matrix that represent angles corresponding to the beam vectors, using the direction weighting vector, and determines a resulting functional matrix as the pre-coding matrix, where all the beam vectors in the vertical dimension in the first level of pre-coding matrix correspond to the same angle.

Or, the network side performs interpolation on such components of all the beam vectors in each polarization direction in the vertical dimension in the first level of pre-coding matrix that represent angles corresponding to the beam vectors, using the direction weighting vector, and determines a resulting functional matrix as the pre-coding matrix, where all the beam vectors in the horizontal dimension in the first level of pre-coding matrix correspond to the same angle.

Or, the network side performs interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension that represent angles corresponding to the beam vectors, using the direction weighting vector, and determines a resulting functional matrix as the pre-coding matrix.

The processing flows of the methods above can be performed in software program, which can be stored in a storage medium, and when the stored software program is invoked, it executes the steps of the methods above.

Based upon the same inventive idea, an embodiment of the invention further provides an apparatus for transmitting coding indication information, and since the apparatus addresses the problem under a similar principle to the method above for transmitting coding indication information, reference can be made to the implementation of the method for an implementation of the apparatus, and a repeated description thereof will be omitted here.

Figure 3:
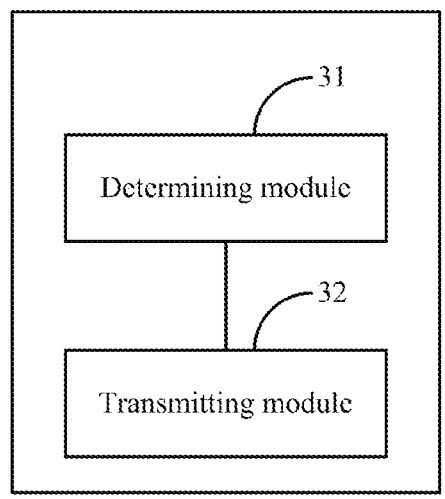
FIG. 3 is a schematic diagram of an apparatus for transmitting coding indication information according to an embodiment of the invention.

As illustrated in FIG. 3, an embodiment of the invention further provides an apparatus for transmitting coding indication information, where the apparatus includes: a determining module 31 configured to determine first pre-coding indication information and second pre-coding indication information, where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and a transmitting module 32 configured to transmit the first pre-coding indication information and the second pre-coding indication information to the network side.

In an implementation, the determining module 31 is configured to: select a first level of pre-coding matrix from a set of first level of pre-coding matrixes, and determine the first pre-coding indication information corresponding to the selected first level of pre-coding matrix; and select a direction weighting vector from a set of direction weighting vector, and select a phase adjusting factor from a set of phase adjusting factor; and determine index information of a combination of the selected direction weighting vector and the selected phase adjusting factor among all the possible combinations as the second pre-coding indication information, or determine index information of the selected phase adjusting factor in the set of phase adjusting factors, and bit information representing the value of the selected direction weighting vector as the second pre-coding indication information.

In an implementation, a beam vector in the first level of pre-coding matrix is a function of the value of an angle corresponding to the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then: the pre-coding matrix is a functional matrix obtained as a result of interpolation on such components of all the beam vectors in each polarization direction in the horizontal dimension in the first level of pre-coding matrix that represent angles corresponding to the beam vectors, using the direction weighting vector, where all the beam vectors in the vertical dimension in the first level of pre-coding matrix correspond to the same angle.

Or, the pre-coding matrix is a functional matrix obtained as a result of interpolation on such components of all the beam vectors in each polarization direction in the vertical dimension in the first level of pre-coding matrix that represent angles corresponding to the beam vectors, using the direction weighting vector, where all the beam vectors in the horizontal dimension in the first level of pre-coding matrix correspond to the same angle.

Or, the pre-coding matrix is a functional matrix obtained as a result of interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension that represent angles corresponding to the beam vectors, using the direction weighting vector.

Based upon the same inventive idea, an embodiment of the invention further provides an apparatus for determining a pre-coding matrix, and since the apparatus addresses the problem under a similar principle to the method above for determining a pre-coding matrix, reference can be made to the implementation of the method for an implementation of the apparatus, and a repeated description thereof will be omitted here.

Figure 4:
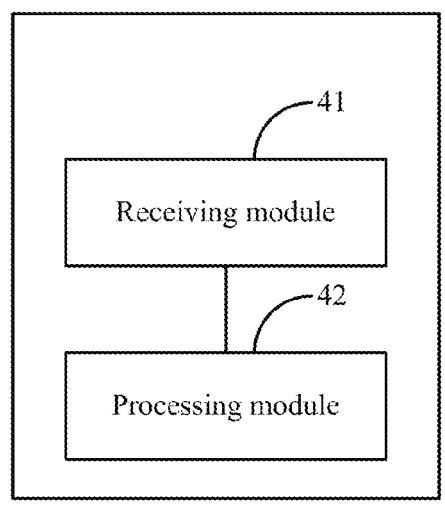
FIG. 4 is a schematic diagram of an apparatus for determining a pre-coding matrix according to an embodiment of the invention.

As illustrated in FIG. 4, an embodiment of the invention further provides an apparatus for determining a pre-coding matrix, where the apparatus includes: a receiving module 41 configured to receive first pre-coding indication information and second pre-coding indication information transmitted by a UE; and a processing module 42 configured to determine a pre-coding matrix from the first pre-coding indication information and the second pre-coding indication information.

Where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

In an implementation, the processing module 42 is configured to: determine the first level of pre-coding matrix corresponding to the first pre-coding indication information; determine the direction weighting vector and the phase adjusting factor corresponding to the second pre-coding indication information; and determine a matrix which is a function of the first level of pre-coding matrix, the direction weighting vector and the phase adjusting factor as the pre-coding matrix.

In an implementation, a beam vector in the first level of pre-coding matrix is a function of the value corresponding to an angle of the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then the processing module 42 will be configured to: perform interpolation on such components of all the beam vectors in each polarization direction in the horizontal dimension in the first level of pre-coding matrix that represent angles corresponding to the beam vectors, using the direction weighting vector, and determine a resulting functional matrix as the pre-coding matrix, where all the beam vectors in the vertical dimension in the first level of pre-coding matrix correspond to the same angle; or perform interpolation on such components of all the beam vectors in each polarization direction in the vertical dimension in the first level of pre-coding matrix that represent angles corresponding to the beam vectors, using the direction weighting vector, and determine a resulting functional matrix as the pre-coding matrix, where all the beam vectors in the horizontal dimension in the first level of pre-coding matrix correspond to the same angle; or perform interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension that represent angles corresponding to the beam vectors, using the direction weighting vector, and to determine a resulting functional matrix as the pre-coding matrix.

The structure of and processing in a UE according to an embodiment of the invention will be described below in connection with a possible hardware structure thereof.

Figure 5:
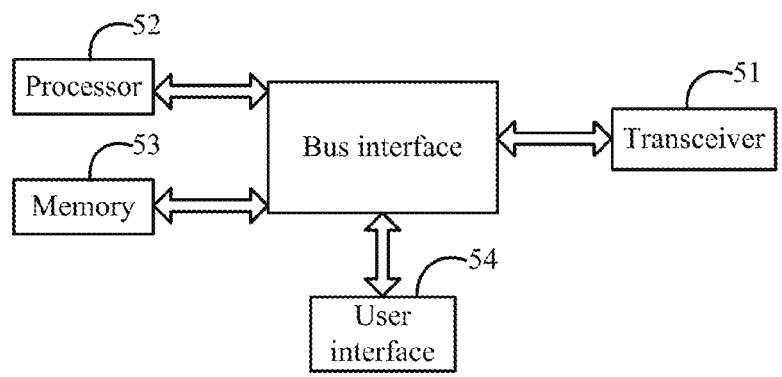
FIG. 5 is a schematic diagram of a UE according to an embodiment of the invention.

In the embodiment illustrated in FIG. 5, the UE includes a transceiver 51, and at least one processor 52 connected with the transceiver 51.

Where the processor 52 is configured to read programs in a memory 53 to execute the following operations: determining first pre-coding indication information and second pre-coding indication information, where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

The transceiver 51 is configured to be controlled by the processor 52 to transmit the first pre-coding indication information and the second pre-coding indication information to the network side.

Here in FIG. 5, the bus architecture can include any number of interconnecting buses and bridges to particularly link together various circuits including one or more processors represented by the processor 52, and memories represented by the memory 53. The bus architecture can further link together various other circuits, e.g., peripheral devices, manostats, power management circuits, etc., all of which are well known in the art, so a further description thereof will be omitted in this context. The bus interface serves as an interface. The transceiver 51 can be a number of elements including a transmitter and a receiver, which are units for communication with various other devices over a transmission medium. For different user equipments, a user interface 54 can also be an interface via which desirable devices can be connected internally or externally, and the connected devices can include but will not be limited to a keypad, a display, a speaker, a microphone, a joystick, etc.

The processor 52 is responsible for managing the bus architecture and performing normal processes, and the memory 53 can store data for use by the processor 52 in performing the operations.

In an implementation, the processor 52 is configured to: select a first level of pre-coding matrix from a set of first level of pre-coding matrixes, and determine the first pre-coding indication information corresponding to the selected first level of pre-coding matrix; and select a direction weighting vector from a set of direction weighting vector, and select a phase adjusting factor from a set of phase adjusting factor; and determine index information of a combination of the selected direction weighting vector and the selected phase adjusting factor among all the possible combinations as the second pre-coding indication information, or determine index information of the selected phase adjusting factor in the set of phase adjusting factors, and bit information representing the value of the selected direction weighting vector as the second pre-coding indication information.

In an implementation, a beam vector in the first level of pre-coding matrix is a function of the value of an angle corresponding to the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then: the pre-coding matrix is a functional matrix obtained as a result of interpolation on such components of all the beam vectors in each polarization direction in the horizontal dimension in the first level of pre-coding matrix that represent angles corresponding to the beam vectors, using the direction weighting vector, where all the beam vectors in the vertical dimension in the first level of pre-coding matrix correspond to the same angle; or the pre-coding matrix is a functional matrix obtained as a result of interpolation on such components of all the beam vectors in each polarization direction in the vertical dimension in the first level of pre-coding matrix that represent angles corresponding to the beam vectors, using the direction weighting vector, where all the beam vectors in the horizontal dimension in the first level of pre-coding matrix correspond to the same angle; or the pre-coding matrix is a functional matrix obtained as a result of interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension that represent angles corresponding to the beam vectors, using the direction weighting vector.

The structure of and processing in an eNB according to an embodiment of the invention will be described below in connection with a possible hardware structure thereof.

Figure 6:
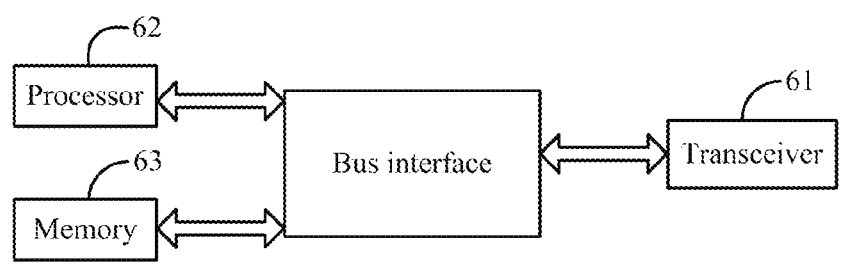
FIG. 6 is a schematic diagram of an eNB according to an embodiment of the invention.

In the embodiment illustrated in FIG. 6, the eNB includes a transceiver 61, and at least one processor 62 connected with the transceiver 61.

Where the processor 62 is configured to read programs in a memory 63 to execute the following operations: receiving first pre-coding indication information and second pre-coding indication information transmitted by a UE through the transceiver 61; and determining a pre-coding matrix from the first pre-coding indication information and the second pre-coding indication information.

Where the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

Here in FIG. 6, the bus architecture can include any number of interconnecting buses and bridges to particularly link together various circuits including one or more processors represented by the processor 62, and memories represented by the memory 63. The bus architecture can further link together various other circuits, e.g., peripheral devices, manostats, power management circuits, etc., all of which are well known in the art, so a further description thereof will be omitted in this context. The bus interface serves as an interface. The transceiver 61 can be a number of elements including a transmitter and a receiver, which are units for communication with various other devices over a transmission medium.

The processor 62 is responsible for managing the bus architecture and performing normal processes, and the memory 63 can store data for use by the processor 62 in performing the operations.

In an implementation, the processor 62 is configured to: determine the first level of pre-coding matrix corresponding to the first pre-coding indication information; determining the direction weighting vector and the phase adjusting factor corresponding to the second pre-coding indication information; and determining a matrix which is a function of the first level of pre-coding matrix, the direction weighting vector and the phase adjusting factor as the pre-coding matrix.

In an implementation, a beam vector in the first level of pre-coding matrix is a function of the value corresponding to an angle of the beam vector, and such a component of the beam vector that represents the angle corresponding to the beam vector is the value of the angle corresponding to the beam vector; or a beam vector in the first level of pre-coding matrix is a DFT vector, and such a component of the beam vector that represents the angle corresponding to the beam vector is an exponent component of each element in the beam vector.

Further to any one of the embodiments above, if antenna ports of the UE are two-dimension antenna ports, then the processor 62 will be configured to: perform interpolation on such components of all the beam vectors in each polarization direction in the horizontal dimension in the first level of pre-coding matrix that represent angles corresponding to the beam vectors, using the direction weighting vector, and determine a resulting functional matrix as the pre-coding matrix, where all the beam vectors in the vertical dimension in the first level of pre-coding matrix correspond to the same angle; or perform interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension in the first level of pre-coding matrix that represent angles corresponding to the beam vectors, using the direction weighting vector, and determine a resulting functional matrix as the pre-coding matrix, where all the beam vectors in the horizontal dimension in the first level of pre-coding matrix correspond to the same angle; or perform interpolation on such components of all the beam vectors in each polarization direction in the horizontal dimension in the first level of pre-coding matrix that represent angles corresponding to the beam vectors, using the direction weighting vector, and such components of all the beam vectors in each polarization direction in the vertical dimension that represent angles corresponding to the beam vectors, using the direction weighting vector, and to determine a resulting functional matrix as the pre-coding matrix.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore the invention can be embodied in the form of a computer program product embodied in one or more computer useable storage mediums (including but not limited to a disk memory, a CD-ROM, an optical memory, etc.) in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for transmitting coding indication information, the method comprising:
    determining, by a User Equipment, UE, first pre-coding indication information and second pre-coding indication information, wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and
    transmitting, by the UE, the first pre-coding indication information and the second pre-coding indication information to the network side.

2. The method according to claim 1, wherein determining, by the UE, the first pre-coding indication information and the second pre-coding indication information comprises:
    selecting, by the UE, a first level of pre-coding matrix from a set of first level of pre-coding matrixes, and determining the first pre-coding indication information corresponding to the selected first level of pre-coding matrix; and
    selecting, by the UE, a direction weighting vector from a set of direction weighting vector, and selecting a phase adjusting factor from a set of phase adjusting factor; and determining index information of a combination of the selected direction weighting vector and the selected phase adjusting factor among all the possible combinations as the second pre-coding indication information, or determining index information of the selected phase adjusting factor in the set of phase adjusting factors, and bit information representing a value of the selected direction weighting vector as the second pre-coding indication information.

3. The method according to claim 1, wherein a beam vector in the first level of pre-coding matrix is a function of the value of an angle corresponding to the beam vector, and such a component of the beam vector that represents the angle corresponding to the beam vector is the value of the angle corresponding to the beam vector; or
    a beam vector in the first level of pre-coding matrix is a Discrete Fourier Transform, DFT, vector, and such a component of the beam vector that represents the angle corresponding to the beam vector is an exponent component of each element in the beam vector.

4. The method according to claim 1, wherein if antenna ports of the UE are two-dimension antenna ports, then:
    the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, wherein all the beam vectors in a vertical dimension in the first level of pre-coding matrix correspond to a same angle; or the pre-coding matrix is a functional matrix obtained as a result of interpolation on such components of all the beam vectors in each polarization direction in a vertical dimension in the first level of pre-coding matrix that represent angles corresponding to the beam vectors, using the direction weighting vector, wherein all the beam vectors in a horizontal dimension in the first level of pre-coding matrix correspond to a same angle; or the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector.

5. A method for determining a pre-coding matrix, the method comprising:

receiving, by a network side, first pre-coding indication information and second pre-coding indication information transmitted by a User Equipment, UE; and determining, by the network side, a pre-coding matrix from the first pre-coding indication information and the second pre-coding indication information;

wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor.

6. The method according to claim 5, wherein determining, by the network side, the pre-coding matrix comprises:

determining, by the network side, the first level of pre-coding matrix corresponding to the first pre-coding indication information;

determining, by the network side, the direction weighting vector and the phase adjusting factor corresponding to the second pre-coding indication information; and determining, by the network side, a matrix which is a function of the first level of pre-coding matrix, the direction weighting vector and the phase adjusting factor as the pre-coding matrix.

7. The method according to claim 5, wherein a beam vector in the first level of pre-coding matrix is a function of the value corresponding to an angle of the beam vector, and such a component of the beam vector that represents the angle corresponding to the beam vector is a value of the angle corresponding to the beam vector; or a beam vector in the first level of pre-coding matrix is a Discrete Fourier Transform, DFT vector, and such a component of the beam vector that represents the angle corresponding to the beam vector is an exponent component of each element in the beam vector.

8. The method according to claim 5, wherein if antenna ports of the UE are two-dimension antenna ports, then determining, by the network side, the pre-coding matrix comprises:

performing, by the network side, interpolation on such components of all the beam vectors in each polarization direction in a horizontal dimension in the first level of pre-coding matrix that represent angles corresponding to the beam vectors, using the direction weighting vector, and determining a resulting functional matrix as the pre-coding matrix, wherein all the beam vectors in a vertical dimension in the first level of pre-coding matrix correspond to a same angle; or performing, by the network side, interpolation on such components of all the beam vectors in each polarization direction in a vertical dimension in the first level of pre-coding matrix that represent angles corresponding to the beam vectors, using the direction weighting vector, and determining a resulting functional matrix as the pre-coding matrix, wherein all the beam vectors in a horizontal dimension in the first level of pre-coding matrix correspond to a same angle; or performing, by the network side, interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector, and determining a resulting functional matrix as the pre-coding matrix.

9. An apparatus for transmitting coding indication information, the apparatus comprising a transceiver, at least one processor connected with the transceiver, and a memory;

wherein the processor is configured to read programs in the memory to:

determine first pre-coding indication information and second pre-coding indication information, wherein the first pre-coding indication information corresponds to a first level of pre-coding matrix, the second pre-coding indication information corresponds to direction weighting vectors and phase adjusting factors, the direction weighting vectors are used for interpolation on such components of respective beam vectors in each polarization direction in the first level of pre-coding matrix that represent angles corresponding to the beam vectors, the phase adjusting factors are used for phase adjustment on the different polarization directions of the first level of pre-coding matrix, and a pre-coding matrix is generated from the first level of pre-coding matrix, the direction weighting vector, and the phase adjusting factor; and transmit the first pre-coding indication information and the second pre-coding indication information to the network side through the transceiver.

10. The apparatus according to claim 9, wherein the processor is configured to read programs in the memory to:

select a first level of pre-coding matrix from a set of first level of pre-coding matrixes, and determine the first pre-coding indication information corresponding to the selected first level of pre-coding matrix; and select a direction weighting vector from a set of direction weighting vector, and select a phase adjusting factor from a set of phase adjusting factor; and determine index information of a combination of the selected direction weighting vector and the selected phase adjusting factor among all the possible combinations as the second pre-coding indication information, or determine index information of the selected phase adjusting factor in the set of phase adjusting factors, and bit information representing a value of the selected direction weighting vector as the second pre-coding indication information.

11. The apparatus according to claim 9, wherein a beam vector in the first level of pre-coding matrix is a function of the value of an angle corresponding to the beam vector, and such a component of the beam vector that represents the angle corresponding to the beam vector is the value of the angle corresponding to the beam vector; or
    a beam vector in the first level of pre-coding matrix is a DFT vector, and such a component of the beam vector that represents the angle corresponding to the beam vector is an exponent component of each element in the beam vector.

12. The apparatus according to claim 9, wherein if antenna ports of the apparatus are two-dimension antenna ports, then:
    the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, wherein all the beam vectors in a vertical dimension in the first level of pre-coding matrix correspond to the same angle; or
the pre-coding matrix is a functional matrix obtained as a result of interpolation on such components of all the beam vectors in each polarization direction in a vertical dimension in the first level of pre-coding matrix that represent angles corresponding to the beam vectors, using the direction weighting vector, wherein all the beam vectors in a horizontal dimension in the first level of pre-coding matrix correspond to the same angle; or
the pre-coding matrix is a functional matrix obtained as a result of interpolation on such components of all the beam vectors in each polarization direction in a horizontal dimension in the first level of pre-coding matrix that represent angles corresponding to the beam vectors, using the direction weighting vector, and such components of all the beam vectors in each polarization direction in a vertical dimension that represent angles corresponding to the beam vectors, using the direction weighting vector.

\* \* \* \* \*